(12) United States Patent
Yatsuda et al.

(10) Patent No.: US 8,198,183 B2
(45) Date of Patent: Jun. 12, 2012

(54) FORMING METHOD OF ETCHING MASK, CONTROL PROGRAM AND PROGRAM STORAGE MEDIUM

(75) Inventors: Koichi Yatsuda, Nirasaki (JP); Eiichi Nishimura, Nirasaki (JP)

(73) Assignee: Tokyo Electron Limited (JP)

( * ) Notice: Subject to any disclaimer, the term of this patent is extended or adjusted under 35 U.S.C. 154(b) by 464 days.

(21) Appl. No.: 12/441,823

(22) PCT Filed: Oct. 23, 2008

(86) PCT No.: PCT/JP2008/002997
§ 371 (c)(1),
(2), (4) Date: Mar. 18, 2009

(87) PCT Pub. No.: WO2009/054131
PCT Pub. Date: Apr. 30, 2009

(65) Prior Publication Data
US 2009/0291560 A1    Nov. 26, 2009

Related U.S. Application Data

(60) Provisional application No. 61/024,393, filed on Jan. 29, 2008.

(30) Foreign Application Priority Data

Oct. 26, 2007    (JP) .................................. 2007-278450

(51) Int. Cl.
*H01L 21/38*    (2006.01)
*H01L 21/4763*    (2006.01)

(52) U.S. Cl. .......................... 438/551; 438/553; 438/622

(58) Field of Classification Search ............... 438/551, 438/552, 622
See application file for complete search history.

(56) References Cited

U.S. PATENT DOCUMENTS

| | | | |
|---|---|---|---|
| 2002/0094688 A1 | 7/2002 | Mitsuiki | |
| 2007/0202697 A1 | 8/2007 | Jung | |

FOREIGN PATENT DOCUMENTS

| | | |
|---|---|---|
| CN | 101026086 | 8/2007 |
| JP | 63-170917 | 7/1988 |
| JP | 07-147219 | 6/1995 |
| JP | 2002-217170 | 8/2002 |
| JP | 2007-027742 | 2/2007 |
| JP | 2007-227934 | 9/2007 |
| KR | 10-2002-0061480 | 7/2002 |
| KR | 10-2007-0088248 | 8/2007 |

OTHER PUBLICATIONS

International Search Report for PCT/JP2008/002997 dated Jan. 20, 2009.
Written Opinion for PCT/JP2008/002997 dated Jan. 20, 2009.
Japanese Office Action—Japanese Application No. 2007-278450 issued on Sep. 6, 2011, citing JP 63-170917 and JP 7-147219.

*Primary Examiner* — James Mitchell
(74) *Attorney, Agent, or Firm* — Cantor Colburn LLP

(57) ABSTRACT

A feedforward control is performed so that a line width of a mask constituted by an $Si_3N_4$ layer 102 formed by using a photoresist 105b as a mask is to be the same as a line width of a mask pattern constituted by an $SiO_2$ layer 103 based on a measured line width of the photoresist 105b and the measured line width of the mask pattern constituted by the $SiO_2$ layer 103. For example, a control of a trimming amount of the line width of the photoresist 105b is performed so that the line width of the photoresist 105b is to be the same as the line width of the mask pattern constituted by the $SiO_2$ layer 103.

1 Claim, 2 Drawing Sheets

[Fig. 1]

[Fig. 2]
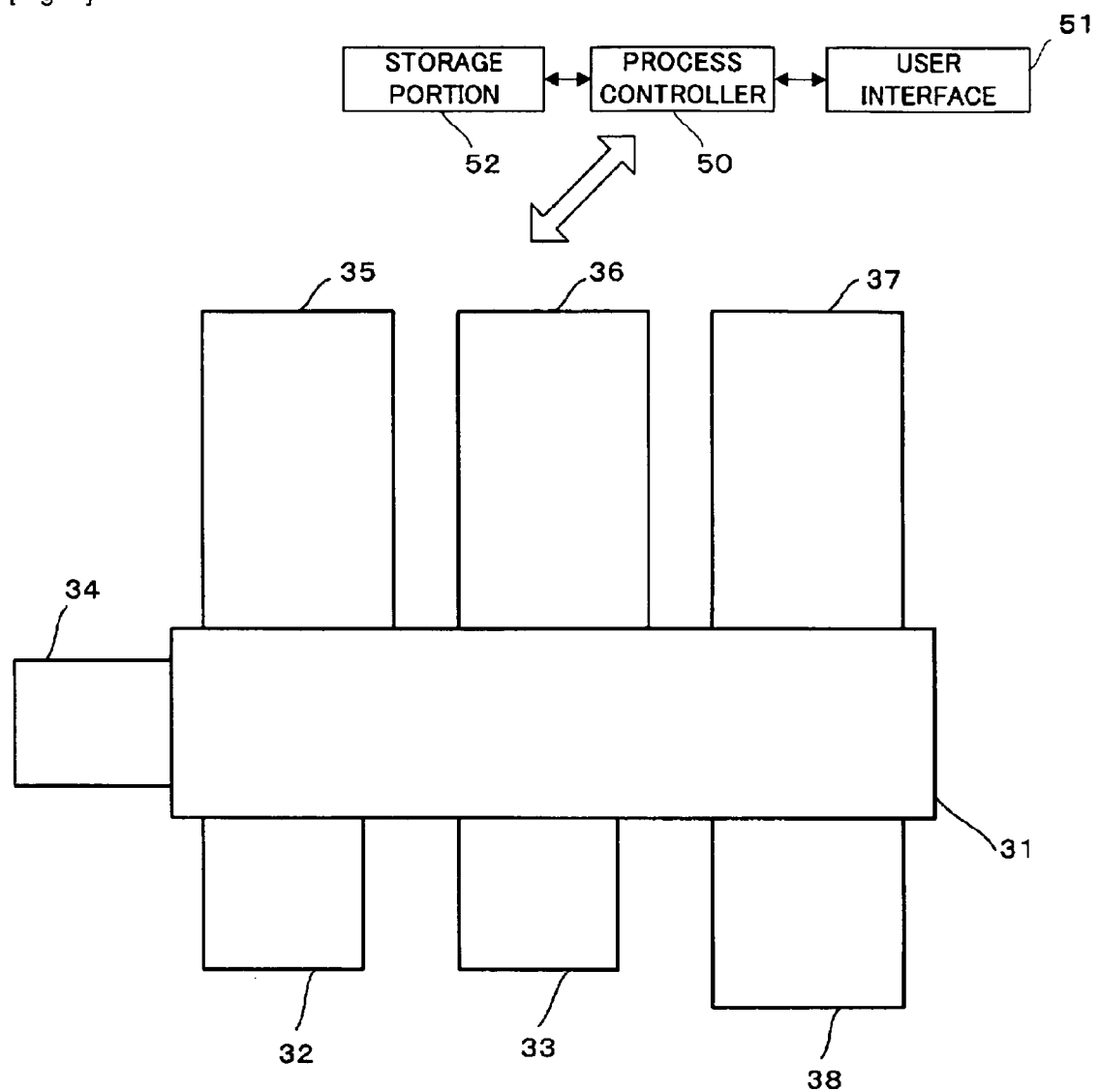

FORMING METHOD OF ETCHING MASK, CONTROL PROGRAM AND PROGRAM STORAGE MEDIUM

TECHNICAL FIELD

The present invention relates to a forming method of an etching mask, a control program, and a program storage medium to form the etching mask used when an etching process such as a plasma etching is performed on a substrate such as a semi-conductor wafer.

BACKGROUND ART

Conventionally, a fine circuit pattern and so on has been formed by performing an etching process such as a plasma etching on a substrate such as a semiconductor wafer, in a manufacturing process of a semiconductor device and so on. An etching mask is formed by a photolithography process using a photoresist, in such an etching process flow.

Various technologies have been developed to correspond to miniaturization of the pattern to be formed in the photolithography process as stated above. As one of these technologies, there is so-called a double patterning. This double patterning is the one enabling a formation of an etching mask with finer interval compared to a case when the etching mask is formed by one time patterning, by performing a two-stage patterning of a first mask pattern forming step and a second mask pattern forming step performed after the first mask pattern forming step (for example, refer to Patent Reference 1).
Patent Citation 1: Patent 2007-027742(KOKAI)

DISCLOSURE OF INVENTION

As stated above, in the double patterning technology, the etching mask is formed, with approximately a half line width of a line width obtained by, for example, the one time patterning by performing the two-stage patterning of the first mask pattern forming step and the second mask pattern forming step performed after the first mask pattern forming step.

However, it is difficult to equalize CDs (Critical Dimension (for example, line width and so on)) of the pattern formed by the first mask pattern forming step and the pattern formed by the second mask pattern forming step, and therefore, there is a problem that the CDs become different and uneven, in the conventional technology. Accordingly, there is a problem in which a manufactured device does not function and so on because transistors and contact resistances adjacent but different come to exist.

The present invention is made to address to circumstances of the conventional technology, and to provide a forming method of an etching mask, a control program and a program storage medium capable of improving evenness of the CDs of the patterns in the double patterning, and of forming the good etching mask with even CDs.

An aspect of a forming method of an etching mask of the present invention is the forming method of the etching mask to perform an etching of an etching object layer on a substrate into a predetermined pattern, including: a first mask pattern forming step; and a second mask pattern forming step performed after the first mask pattern forming step, the forming method of the etching mask includes: performing a first measurement measuring a size at a predetermined position of a first pattern formed by the first mask pattern forming step, between the first mask pattern forming step and the second mask pattern forming step, in which a size at a predetermined position of a second pattern formed at the time of the second mask pattern forming step is corrected based on a value of the size measured at the step of performing the first measurement, to make the sizes at the predetermined positions of the first pattern formed by the first mask pattern forming step and the second pattern formed by the second mask pattern forming step approximately the same.

Another aspect of the forming method of the etching mask of the present invention is the above-stated forming method of the etching mask, in which the second mask pattern forming step includes: patterning a photoresist; performing a second measurement measuring a size at a predetermined position of a pattern of the photoresist; and trimming the pattern of the photoresist based on a value of the size measured at the step of performing the second measurement and the value of the size measured at the step of performing the first measurement.

Still another aspect of the forming method of the etching mask of the present invention is the above-stated forming method of the etching mask, in which the sizes at the predetermined positions are widths of the first and second patterns.

Still another aspect of the forming method of the etching mask of the present invention is the above-stated forming method of the etching mask, in which the substrate has a second mask layer formed on the etching object layer and a first mask layer formed on the second mask layer, in which the first pattern is formed at the first mask layer in the first mask pattern forming step, and the first pattern and the second pattern are formed at the second mask layer in the second mask pattern forming step.

An aspect of a control program of the present invention operating on a computer, and controlling a device forming an etching mask to perform an etching of an etching object layer on a substrate into a predetermined pattern, the program includes: controlling the device forming the etching mask such that the above-stated forming method of the etching mask is performed at an execution time.

An aspect of a program storage medium of the present invention storing a control program operating on a computer to control a device forming an etching mask to perform an etching of an etching object layer on a substrate into a predetermined pattern, in which the control program controls the device forming the etching mask such that the above-stated forming method of the etching mask is performed at an execution time.

BRIEF DESCRIPTION OF THE DRAWINGS

FIG. 2 is a view schematically showing a schematic configuration of a device used for the embodiment of the present invention.

BEST MODE FOR CARRYING OUT THE INVENTION

Hereinafter, details of the present invention are described with reference to the drawings as for embodiments.

Figure 1A:
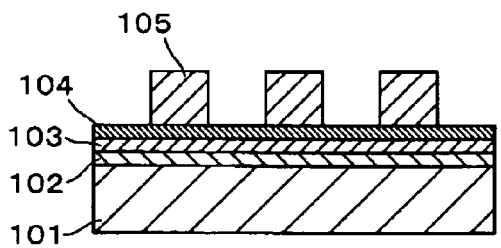
FIG. 1A to FIG. 1G are views to explain a forming method of an etching mask according to an embodiment of the present invention.

FIG. 1A to FIG. 1G are views enlargedly and schematically showing a part of a semi-conductor wafer according to an embodiment of the present invention, and showing a process of a forming method of an etching mask according to the embodiment. As shown in FIG. 1A, an $Si_3N_4$ layer 102 as a main mask layer (second mask layer) is formed on an etching object layer 101 of which object is a patterning. An $SiO_2$ layer 103 as a sacrificial mask layer (first mask layer) is formed on the $Si_3N_4$ layer 102. Besides, an anti-reflection film (BARC)

104 is formed on the SiO$_2$ layer 103, and a photoresist 105 is formed on the anti-reflection film (BARC) 104. The photoresist 105 is patterned by exposure and development processes to be a pattern having a predetermined shape.

Figure 1E:
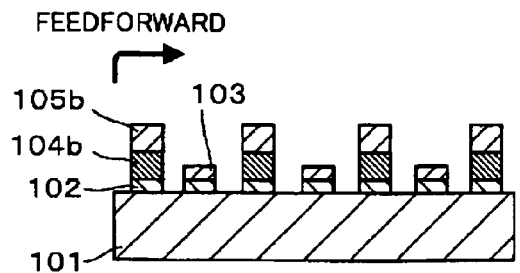
Figure 1B:
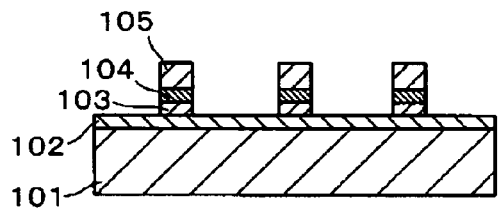

In a first mask pattern forming step, a trimming to make a line width of the photoresist 105 thin is performed on the photoresist 105 which is patterned by the exposure and development processes so as to be a desired CD, for example, a desired line width. The anti-reflection film (BARC) 104 and the SiO$_2$ layer 103 are etched by using the trimmed photoresist 105 as a mask to be a state as shown in FIG. 1B. The above-stated trimming of the photoresist 105 and the etching of the anti-reflection film (BARC) 104 can be performed by, for example, a plasma etching using an oxygen plasma and so on (it is the same as in the processes shown in the following). Besides, the etching of the SiO$_2$ layer 103 can be performed by using mixed gas of CF based gas such as $CF_4$, $C_4F_8$, $CHF_3$, $CH_3F$, $CH_2F_2$ and Ar gas and so on, or gas in which oxygen is added to the mixed gas if necessary, and so on.

Figure 1F:
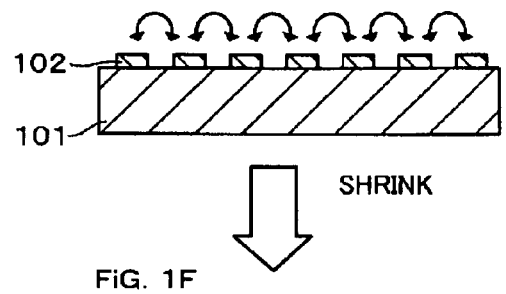
Figure 1C:
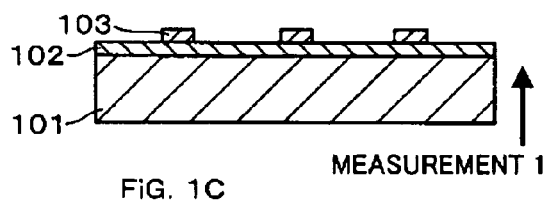

Next, the photoresist 105 and the anti-reflection film (BARC) 104 are removed to obtain a mask pattern (first pattern) constituted by the SiO$_2$ layer 103 shown in FIG. 1C. Hereinabove is the first mask pattern forming step, and thereafter, a size (CD) at a predetermined position of the mask pattern (first pattern) constituted by the SiO$_2$ layer 103, namely, the line width in the present embodiment, is measured (measurement 1).

Figure 1G:
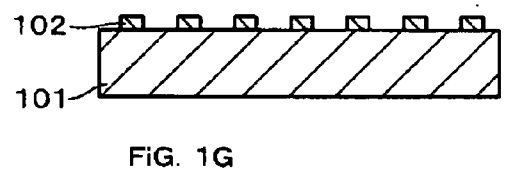
Figure 1D:
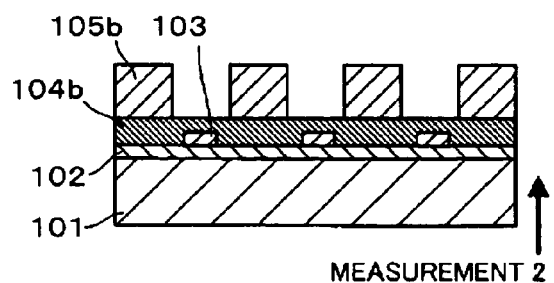

Next, a second mask pattern forming step is performed. As shown in FIG. 1D, at first, an anti-reflection film (BARC) 104b is formed on the above-stated mask pattern (first pattern) constituted by the SiO$_2$ layer 103, then a photoresist 105b is formed on the anti-reflection film (BARC) 104b, and the photoresist 105b is patterned by the exposure and development processes, to be a pattern having a predetermined shape, in the second mask pattern forming step.

Next, a size (CD) at a predetermined position of the patterned photoresist 105b, namely, the line width in this embodiment is measured (measurement 2). After that, a feedforward control is performed such that a line width of a mask pattern (second pattern) constituted by the Si$_3$N$_4$ layer 102 formed by an etching process described in the following is to be the same as the line width of the mask pattern (first pattern) constituted by the SiO$_2$ layer 103, by using the photoresist 105b as a mask based on the measured line width of the photoresist 105b and the above-stated line width of the mask pattern (first pattern) constituted by the SiO$_2$ layer 103. In this case, for example, a control of a trimming amount of the line width of the photoresist 105b is performed so that the line width of the photoresist 105b is to be the same as the line width of the mask pattern (first pattern) constituted by the SiO$_2$ layer 103. After that, the etching of the anti-reflection film (BARC) 104b and the etching of the Si$_3$N$_4$ layer 102 as the main mask layer (second mask layer) are performed while using this trimmed photoresist 105b as a mask. When the etching of the Si$_3$N$_4$ layer 102 is performed, the mask pattern (first pattern) constituted by the SiO$_2$ layer 103 formed at the first mask pattern forming step also works as a mask, and the etching of the Si$_3$N$_4$ layer 102 is performed to be a state as shown in FIG. 1E. This etching can be performed by using, for example, the mixed gas of the CF based gas such as $CF_4$, $C_4F_8$, $CHF_3$, $CH_3F$, $CH_2F_2$ and the Ar gas and so on, or the gas in which oxygen is added to the mixed gas if necessary, and so on.

Next, the photoresist 105b, the anti-reflection film (BARC) 104b, and the SiO$_2$ layer 103 are removed to obtain a mask pattern of the Si$_3$N$_4$ layer 102 with even line width as shown in FIG. 1F. After that, the pattern of the Si$_3$N$_4$ layer 102 is shrunken by the trimming to make the line width further thinner as desired, and the etching of the etching object layer 101 being a lower layer is performed while using the above as an etching mask, as shown in FIG. 1G.

In the above-stated embodiment, it is possible to improve the evenness of the line width of the etching mask by performing the feedforward control based on the measured line width of the mask pattern (first pattern) constituted by the SiO$_2$ layer 103 formed at the first mask pattern forming step, and the line width of the photoresist 105b measured at the second mask pattern forming step.

Actually, when an etching mask (hard mask) is formed on a semiconductor wafer with a target line width of 50.1 nm in a forming process of a gate mask in a gate process, an average value of the line width is 51.2 nm, and "3 sigma" is 1.98 nm without the above-stated feedforward control. On the other hand, when the feedforward control is performed as the above-stated embodiment, it is possible to make the average value of the line width at 49.7 nm, and to make "3 sigma" at 0.70 nm, and it is possible to drastically improve the evenness of the line width.

FIG. 2 is a top view schematically showing an example of a configuration of a device to implement the above-stated etching mask forming method. This device includes a transfer portion 31 formed in a rectangular shape in which a transfer mechanism transferring a semiconductor wafer W is provided inside thereof. Plural mounting portions 32, 33 on which a cassette or a FOUP accommodating the semiconductor wafer W are mounted, and a measuring unit 38 to measure a size (CD) at a desired portion of a pattern formed on the semiconductor wafer W are provided at one side (lower side in the drawing) along a long edge direction of the transfer portion 31. Besides, plural plasma etching processing portions 35, 36, 37 to perform an etching process on the semiconductor wafer W are provided at the other side (upper side in the drawing) along the long edge direction of the transfer portion 31.

Besides, an aligning unit 34 to perform an alignment of the semiconductor wafer W is provided at one end portion of the transfer portion 31. The semiconductor wafer W brought out of the cassette or the FOUP mounted on the mounting portions 32, 33 by the transfer mechanism of the transfer portion 31 is once transferred to the aligning unit 34, an alignment is performed there, and thereafter, it is transferred to the respective plasma etching processing portions 35, 36, 37 and the measuring unit 38 to perform the etching process and the measurement of the size (CD) at the desired portion of the pattern. After the processes, the semiconductor wafer W is accommodated in the cassette or the FOUP mounted on the mounting portions 32, 33.

The above-stated respective components have a constitution controlled by a process controller 50. A user interface 51 is connected to the process controller 50. The user interface 51 is constituted by a keyboard to perform an input operation and so on of commands, a display visualizing and displaying an operating state of the device, and so on.

Besides, a storage portion 52 storing a control program to realize the various processes performed on the device under the control of the process controller 50, and a control program to make the respective components of the device perform the processes in accordance with process conditions, namely recipes, is connected to the process controller 50. The recipes may be stored on a program storage medium such as a hard disk and a semiconductor memory, or may be set at a predetermined position of the storage portion 52 under a state stored in a portable program storage medium such as a CDROM, DVD. Further, the recipes may be accordingly transmitted from other devices via, for example, a dedicated line.

The desired process is performed at the device under the control of the process controller 50 by calling an arbitrary recipe from the storage portion 52 responding to an instruction and so on from the user interface 51 to let the process controller 50 execute the recipe, according to needs.

INDUSTRIAL APPLICABILITY

The forming method of the etching mask, the control program and the program storage medium of the present invention can be used at a manufacturing field and so on of the semiconductor device. Accordingly, the present invention has an industrial applicability.

The invention claimed is:

1. A forming method of an etching mask to perform an etching of an etching object layer on a substrate into a predetermined pattern, including:

preparing an etching object layer;
forming a main mask layer on the etching object layer;
forming a sacrificial mask layer on the main mask layer;
forming a first mask pattern at the sacrificial mask layer;
performing a first measurement measuring a width of the first mask pattern;
forming a covering layer which covers the first mask pattern;
forming a photoresist on the covering layer;
patterning the photoresist;
performing a second measurement measuring a width of a pattern of the photoresist;
obtaining a second mask pattern by trimming the pattern of the photoresist based on a value of the width measured at the second measurement and the value of the width measured at the first measurement, an amount of the trimming being corrected to make the widths of the first mask pattern and the second mask pattern approximately the same; and
etching the covering layer and the main mask layer by using the first mask pattern and the second mask pattern as masks so as to obtain, at the main mask layer, a first pattern conformed to the first mask pattern and a second pattern conformed to the second mask pattern.

* * * * *